(12) United States Patent
Oh (10) Patent No.: US 8,572,054 B2
(45) Date of Patent: Oct. 29, 2013

(54) FORWARD COMPATIBILITY GUARANTEED DATA COMPRESSION AND DECOMPRESSION METHOD AND APPARATUS THEREOF

(75) Inventor: Yun-Sik Oh, Seoul (KR)

(73) Assignee: Estsoft Corp., Seoul (KR)

( * ) Notice: Subject to any disclaimer, the term of this patent is extended or adjusted under 35 U.S.C. 154(b) by 0 days.

(21) Appl. No.: 13/380,734

(22) PCT Filed: Aug. 31, 2010

(86) PCT No.: PCT/KR2010/005882
§ 371 (c)(1),
(2), (4) Date: Dec. 23, 2011

(87) PCT Pub. No.: WO2011/034299
PCT Pub. Date: Mar. 24, 2011

(65) Prior Publication Data
US 2012/0271802 A1      Oct. 25, 2012

(30) Foreign Application Priority Data

Sep. 21, 2009   (KR) .......................... 10-2009-0089075

(51) Int. Cl.
*G06F 17/30* (2006.01)

(52) U.S. Cl.
USPC ............... 707/693; 707/755; 341/50; 341/87; 370/474

(58) Field of Classification Search
USPC ................... 707/693, E17.002, 755, 999.101; 370/474, 392; 341/87, 50
See application file for complete search history.

(56) References Cited

U.S. PATENT DOCUMENTS 5,455,629 A * 10/1995 Sun et al. .................. 375/240.27
5,579,316 A * 11/1996 Venters et al. ................ 370/392

(Continued)

FOREIGN PATENT DOCUMENTS

JP    04359315    12/1992
JP    05313904    11/1993

(Continued)

OTHER PUBLICATIONS

Abhaya Asthana and Paul Krzyzanowski (AT&T Bell Laboratories)—"A Memory Participative Architecture for High Performance Communication Systems"—1994 IEEE, INFOCOM '94. Networking for Global Communications., 13th Proceedings IEEE—Jun. 12-16, 1996, (pp. 167-174).*

(Continued)

*Primary Examiner* — John E Breene
*Assistant Examiner* — Anh Ly
(74) *Attorney, Agent, or Firm* — Greenberg Traurig, LLP (57) ABSTRACT

A forward compatibility guaranteed data compression and decompression method and apparatus are provided. The compressed data decompression apparatus includes a compressed file parsing unit which parses a compressed file comprising compressed data, a header including information on the compressed data and an extension field to extract the compressed data, and an original file generating unit which decompresses the compressed data to generate an original file. The extension field includes one or more extension field units and an extension field terminating code indicating an end of a region capable of including the extension field units, each of the header and the extension field units starts with a data identification code having the same number of bytes, and the extension field unit further includes its own length data separated by a predetermined number of bytes from its own data identification code. If the data identification code of the extension field unit is not defined while the parsing is carried out based on the data identification code, the compressed file parsing unit skips the extension field unit using the length data without processing the extension field unit.

9 Claims, 4 Drawing Sheets

(56) References Cited

U.S. PATENT DOCUMENTS

| | | | |
|---|---|---|---|
| 5,873,097 A * | 2/1999 | Harris et al. | 707/E17.007 |
| 5,915,094 A * | 6/1999 | Kouloheris et al. | 370/486 |
| 6,081,262 A * | 6/2000 | Gill et al. | 715/202 |
| 6,091,772 A * | 7/2000 | Anderson et al. | 375/240.26 |
| 6,148,429 A | 11/2000 | Tatsuta | |
| 6,657,562 B2 | 12/2003 | Radermacher et al. | |
| 6,750,918 B2 * | 6/2004 | Aneja et al. | 348/569 |
| 7,058,783 B2 | 6/2006 | Chandrasekaran et al. | |
| 7,158,518 B2 * | 1/2007 | Burmeister et al. | 370/392 |
| 7,362,780 B2 * | 4/2008 | Liu | 370/521 |
| 7,739,465 B2 * | 6/2010 | Kameyama et al. | 711/162 |
| 7,940,990 B2 | 5/2011 | Yamada et al. | |
| 8,175,396 B2 | 5/2012 | Song et al. | |
| 2003/0108248 A1 * | 6/2003 | Huang et al. | 382/240 |
| 2003/0227392 A1 * | 12/2003 | Ebert et al. | 340/825.49 |
| 2005/0083934 A1 * | 4/2005 | Tan et al. | 370/392 |
| 2005/0220110 A1 * | 10/2005 | Agarwal | 370/392 |
| 2005/0238008 A1 * | 10/2005 | Fraser | 370/389 |
| 2005/0243187 A1 * | 11/2005 | Watanabe et al. | 348/231.2 |
| 2007/0088674 A1 * | 4/2007 | Kawate et al. | 707/2 |
| 2007/0098016 A1 * | 5/2007 | Kapoor et al. | 370/474 |
| 2007/0109153 A1 * | 5/2007 | Ma et al. | 341/50 |
| 2008/0025298 A1 * | 1/2008 | Lev-Ran et al. | 370/389 |
| 2008/0037540 A1 * | 2/2008 | Ngo et al. | 370/392 |
| 2008/0310452 A1 * | 12/2008 | Vedantham et al. | 370/474 |
| 2009/0154460 A1 * | 6/2009 | Varela et al. | 370/392 |
| 2009/0268660 A1 * | 10/2009 | Agarwal | 370/316 |
| 2009/0268667 A1 * | 10/2009 | Gandham et al. | 370/328 |
| 2009/0284400 A1 * | 11/2009 | Gui et al. | 341/60 |
| 2011/0200048 A1 * | 8/2011 | Thi et al. | 370/392 |
| 2012/0177064 A1 * | 7/2012 | Shi et al. | 370/477 |
| 2012/0268298 A1 * | 10/2012 | Oh | 341/87 |

FOREIGN PATENT DOCUMENTS

| | | |
|---|---|---|
| JP | 2003299016 | 10/2003 |
| JP | 2006031012 | 2/2006 |
| JP | 2007043595 | 2/2007 |
| JP | 200988949 | 4/2009 |
| KR | 20030021345 A | 3/2003 |
| KR | 20040038271 A | 5/2004 |
| KR | 20090068787 A | 6/2009 |

OTHER PUBLICATIONS

Ching Shen Tye and Dr. G. Fairhurst, Electronics Research Group, Department of Engineering, Aberdeen University, Scotland, AB24 3UE.—"A Review of IP Packet Compression Techniques"—2003 PGNet Proceedings of PostGraduate Networking Conference, . . . , 2003—Citeseer—(pp. 1-6).*

Non-final Office Action for U.S. Appl. No. 13/380,751, mailed Mar. 28, 2013.

International Search Report in connection with International Application No. PCT/KR2010/005882.

Written Opinion and International Preliminary Report on Patentability in connection with International Application No. PCT/KR2010/005882.

Office Action issued in connection with Japanese Patent Application No. 2012-522771.

CAD & CG Magazine, vol. 1, No. 4, p. 68-72, Sep. 1, 1999 (6 pages).

C Magazine, vol. 3, No. 1, p. 59-68, Jan. 1, 1991 (11 pages).

Office Action issued on Jun. 28, 2013 in connection with Japanese Patent Application No. 2012-522770, with its English-language translation (6 pages).

* cited by examiner

| | | |
|---|---|---|
| FIRST HEADER(200) – COMPRESSED FILE HEADER | | 1 |
| FIRST EXTENSION FIELD(202) – COMPRESSED FILE HEADER EXTENSION FIELD [SPLIT COMPRESSION INFORMATION, SOLID COMPRESSION INFORMATION, EXTENSION FIELD TERMINATING CODE] | | 1 |
| SECOND HEADER (204) – ORIGINAL FILE HEADER | | 1 | 0~NUMBER OF ORIGINAL FILES |
| SECOND EXTENSION FIELD 206 – ORIGINAL FILE HEADER EXTENSION FIELD [ORIGINAL FILE PATH, COMMENTS, OPERATING SYSTEM FILE SYSTEM BASED FILE INFORMATION, ENCRYPTION INFORMATION, EXTENSION FIELD TERMINATING CODE] | | 1 |
| THIRD HEADER (208) – BLOCK HEADER | 1 | 0~NUMBER OF BLOCKS |
| THIRD EXTENSION FIELD (210) – BLOCK HEADER EXTENSION FIELD [COMMENTS, EXTENSION FIELD TERMINATING CODE] | 1 |
| COMPRESSED DATA (212) – BLOCK BODY | 1 |
| FOURTH EXTENSION FIELD (214) [COMMENTS, EXTENSION FIELD TERMINATING CODE] | | 1 |

FIG. 3

| | | |
|---|---|---|
| ORIGINAL FILE HEADER IDENTIFICATION CODE | 4 | 0X0A8590E3 |
| IDENTIFICATION INFORMATION OF ORIGINAL FILE IN COMPRESSED FILE | 4 | UNIQUE VALUE IS SET FOR EACH ORIGINALFILE |
| FILE LENGTH | 8 | OVERALL SIZE OF ORIGINAL FILE |

FIG. 4

| ORIGINAL FILE PATH IDENTIFICATION CODE | 4 BYTES | 0X0A8591AC | | |
|---|---|---|---|---|
| BIT FLAG | 1 BYTE | BIT | UNSET | SET |
| | | 3 | DO NOT ENCRYPT | ENCRYPT |
| | | 4 | USE UNICODE | USE CODE PAGE |
| | | 5 | ABSOLUTE PATH | RELATIVE PATH |
| SIZE | 2 BYTES | | | |
| CODE PAGE | 0 OR 2 | CODE PAGE CAN BE SPECIFIED WHEN UNICODE IS NOT USED<br>EX)<br>0: DEPEND ON SYSTEM LOCALE<br>932: JAPANESE (SHIFT-JIS)<br>949: KOREAN | | |
| PARENT PATH ID | 0 OR 4 | THIS EXISTS ONLY WHEN FIFTH BIT FLAG IS SET AND IS IDENTIFICATION INFORMATION (ID) IN ORIGINAL FILE HAVING PARENT PATH | | |
| ORIGINAL FILE PATH STRING | | STRING INDICATING ORIGINAL FILE PATH | | |

FORWARD COMPATIBILITY GUARANTEED DATA COMPRESSION AND DECOMPRESSION METHOD AND APPARATUS THEREOF

CROSS-REFERENCE TO RELATED APPLICATIONS

The present application is a U.S. national-phase application of International Application No. PCT/KR2010/005882 filed Aug. 31, 2010, which claims priority to Korean Patent Application No. 10-2009-0089075 filed Sep. 21, 2009.

BACKGROUND

1. Field of the Invention

The present invention relates to a forward compatibility guaranteed data compression and decompression method and apparatus thereof, and more particularly to a compression and decompression method and apparatus for compressing an original file to generate a compressed file and decompressing the compressed file, wherein basic data compression and decompression can be normally performed even when a file compressed in an application supporting a compressed file format of an upper version is decompressed in an application supporting a compressed file format of a lower version.

2. Description of the Related Art

Data compression technology reduces transmission time or saves a storage space by removing an unnecessary portion when data is transmitted or stored. For example, in case of sending documents by facsimile, it takes more time when sending a blank between characters or lines. Accordingly, data is compressed to reduce the transmission time by transmitting a position or size of the blank as a simplified signal or simplifying repeated data. The storage space of a storage medium can be saved by using the technology when storing data in a magnetic tape or disk.

The data compression and decompression technology mainly includes a compression algorithm and a compressed file format. That is, it is important which algorithm is used to reduce the space occupied by the data and which storage configuration is used for the information on the compressed data.

The compressed file format may have various versions with development of technology and improvement of performance. In general, a file compressed in an application supporting a compressed file format of a lower version can be decompressed without any problems in an application supporting a compressed file format of an upper version. This is because a configuration of a compressed file is designed considering backward compatibility based on a lower version when upgrading a version of the compressed file.

However, in an opposite case, i.e., when a file compressed in an application supporting a compressed file format of an upper version is decompressed in an application supporting a compressed file format of a lower version, a problem may occur. This is because a compressed file including a compressed file format configuration or the like which is newly added in an upper version may not be recognized in a lower version. Therefore, there is a demand for a forward compatibility guaranteed compressed file format capable of performing basic data decompression on a compressed file stored in a compressed file format of an upper version.

SUMMARY

A technical object of the present invention is to provide a data compression apparatus and method for generating a compressed file capable of normally performing basic data compression and decompression even when a file compressed in an application supporting a compressed file format of an upper version is decompressed in an application supporting a compressed file format of a lower version.

Another technical object of the present invention is to provide a compressed data decompression apparatus and method capable of normally performing basic data compression and decompression even when a file compressed in an application supporting a compressed file format of an upper version is decompressed in an application supporting a compressed file format of a lower version.

The objects of the present invention are not limited thereto, and the other objects of the present invention will be described in or be apparent to those skilled in the art from the following description of the embodiments.

According to an aspect of the present invention, there is provided a data compression apparatus comprising: a compression unit which generates compressed data by applying a compression algorithm to data to be compressed; and a compressed file generating unit which generates a compressed file comprising the compressed data, a header including information on the compressed data, and an extension field. Preferably, the extension field includes one or more extension field units and an extension field terminating code indicating an end of a region capable of including the extension field units, each of the header and the extension field units starts with a data identification code having the same number of bytes, and the extension field unit further includes its own length data separated by a predetermined number of bytes from its own data identification code.

According to another aspect of the present invention, there is provided a compressed data decompression apparatus comprising: a compressed file parsing unit which parses a compressed file comprising compressed data, a header including information on the compressed data and an extension field to extract the compressed data; and an original file generating unit which decompresses the compressed data to generate an original file. Preferably, the extension field includes one or more extension field units and an extension field terminating code indicating an end of a region capable of including the extension field units, each of the header and the extension field units starts with a data identification code having the same number of bytes, and the extension field unit further includes its own length data separated by a predetermined number of bytes from its own data identification code. Further, preferably, if the data identification code of the extension field unit is not defined while the parsing is carried out based on the data identification code, the compressed file parsing unit skips the extension field unit using the length data without processing the extension field unit.

According to still another aspect of the present invention, there is provided a compressed data decompression method comprising: parsing a compressed file comprising compressed data, a header including information on the compressed data, and an extension field to extract the compressed data; and decompressing the compressed data to generate an original file. Preferably, the extension field includes one or more extension field units and an extension field terminating code indicating an end of a region capable of including the extension field units, each of the header and the extension field units starts with a data identification code having the same number of bytes, and the extension field unit further includes its own length data separated by a predetermined number of bytes from its own data identification code. Further, preferably, said parsing the compressed file to extract the compressed data includes, if the data identification code of the extension field unit is not defined while the parsing is carried out based on the data identification code, skipping the extension field unit using the length data without processing the extension field unit.

According to still another aspect of the present invention, there is provided a computer-readable recording medium storing a program comprising: a function of generating compressed data by applying a compression algorithm to data to be compressed, and a function of generating a compressed file including the compressed data, a header having information on the compressed data and an extension field, wherein the extension field includes one or more extension field units and an extension field terminating code indicating an end of a region capable of including the extension field units, each of the header and the extension field units starts with a data identification code having the same number of bytes, and the extension field unit further includes its own length data separated by a predetermined number of bytes from its own data identification code.

According to still another aspect of the present invention, there is provided a computer-readable recording medium storing a program comprising: a function of parsing a compressed file including compressed data, a header having information on the compressed data and an extension field to extract the compressed data, and a function of decompressing the compressed data to generate an original file, wherein the extension field includes one or more extension field units and an extension field terminating code indicating an end of a region capable of including the extension field units, each of the header and the extension field units starts with a data identification code having the same number of bytes, and the extension field unit further includes its own length data separated by a predetermined number of bytes from its own data identification code, and wherein the function of parsing the compressed file to extract the compressed data further includes, if the data identification code of the extension field unit is not defined while the parsing is carried out based on the data identification code, a function of skipping the extension field unit using the length data without processing the extension field unit.

According to the present invention, there is an effect of normally performing basic data compression and decompression even when a file compressed in an application supporting a compressed file format of an upper version is decompressed in an application supporting a compressed file format of a lower version.

DETAILED DESCRIPTION OF THE EMBODIMENTS

Advantages and features of the present invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the present invention to those skilled in the art, and the present invention will only be defined by the appended claims. Like reference numerals refer to like elements throughout the specification.

The present invention will be described hereinafter with reference to block diagrams or flowchart illustrations of a forward compatibility guaranteed data compression and decompression method and apparatus according to an exemplary embodiment thereof. It will be understood that each block of the flowchart illustrations, and combinations of blocks in the flowchart illustrations can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions specified in the flowchart block or blocks.

And, each block of the block diagrams may represent a module, segment, or portion of a code, which comprises one or more executable instructions for implementing the specified logical function(s). It should also be noted that in some alternative implementations, the functions noted in the blocks may occur out of order. For example, two blocks shown in succession may in fact be substantially executed concurrently or the blocks may sometimes be executed in reverse order depending upon the functionality involved.

Figure 1:
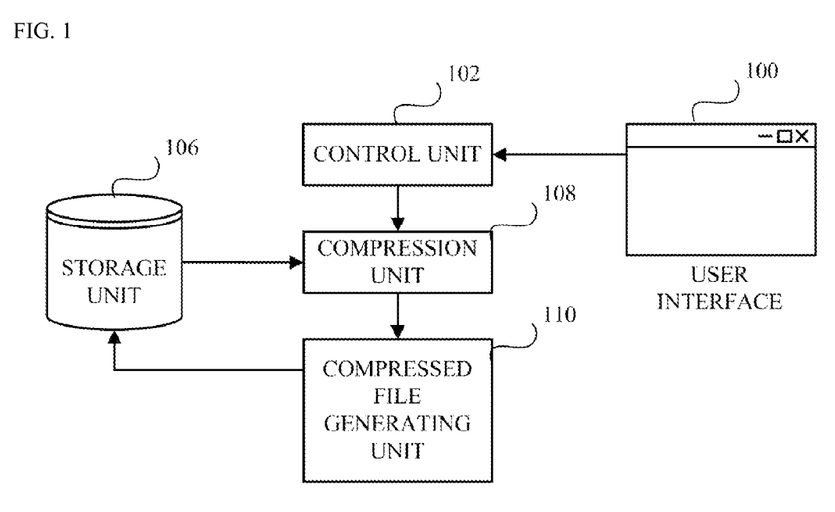
FIG. 1 shows a configuration of a data compression apparatus in accordance with an embodiment of the present invention.

Hereinafter, a configuration and operation of a data compression apparatus in accordance with an embodiment of the present invention will be described with reference to FIG. 1. FIG. 1 shows a configuration of the data compression apparatus in accordance with the embodiment of the present invention. The data compression apparatus in accordance with the embodiment of the present invention may be implemented by executing a program performing a specific function in a general-purpose computer system.

As shown in FIG. 1, the data compression apparatus in accordance with the embodiment of the present invention includes a user interface 100, a control unit 102, a storage unit 106, a compression unit 108, and a compressed file generating unit 110.

The user interface 100 allows a user of the data compression apparatus to specify an original file to be compressed and provides information on the original file to the control unit 102. The term "original file" as used herein refers to a data group to be compressed. The original file should not be construed as a file used as a data storage unit in the general-purpose computer system. That is, the "original file" means a group of data to be compressed. The original file may be, e.g., data temporarily stored in a memory and a file serving as a storage unit in a file system supported by an operating system.

The control unit 102 transmits the information on the original file to a block setting unit 104, and controls the compression unit 108 to load the original file from the storage unit 106 and compress the original file.

The storage unit 106 stores the original file and a compressed file generated by the compressed file generating unit 110. The storage unit 106 may be implemented as at least one of a nonvolatile memory element such as a cache, read only memory (ROM), programmable ROM (PROM), erasable PROM (EPROM), electrically erasable PROM (EEPROM) and flash memory, a volatile memory element such as random access memory (RAM), and a storage medium such as a hard disk drive (HDD), but it is not limited thereto. Further, although the storage unit 106 is directly connected to the compression unit 108 and the compressed file generating unit 110 in FIG. 1, the storage unit 106 may be separated from the data compression apparatus in accordance with the embodiment of the present invention and may be connected to the compression unit 108 and the compressed file generating unit 110 through the network.

The compression unit 108 generates compressed data by applying a compression algorithm to the data to be compressed.

The compressed file generating unit 110 generates a compressed file including the compressed data generated by the compression unit 108, a header having information on the compressed data, and an extension field having one or more extension field units and an extension field terminating code. The compressed file may be provided to the storage unit 106 and stored in the storage unit 106. In this case, each of the header and the extension field units starts with a data identification code having the same number of bytes. It is preferable that the extension field unit further includes its own length data separated by a predetermined number of bytes from its own data identification code.

That is, it can be understood that the compressed file generated by the compressed file generating unit 110 may include three components of the header, the extension field and the compressed data. In this case, two or more headers and extension fields may exist according to the types of the stored information.

For example, the header may be divided into a first header, a second header and a third header according to the included information. Also, the extension field may be divided into a first extension field, a second extension field, a third extension field and a fourth extension field according to the included information. In this case, preferably, the first extension field is located after the first header, the second extension field is located after the second header, the third extension field is located after the third header, and the fourth extension field is located at the end of the compressed file. More specifically, the compressed file may have a configuration in which the first header enabling identification of a compression format, the first extension field including information associated with the first header, the second header including information on the original file included in the compressed file, the second extension field including information associated with the second header, the third header including information on each block in the original file, the third extension field including information associated with the third header, the compressed data of a block corresponding to the third header, and the fourth extension field indicating the end of the compressed file are sequentially located.

Figure 2:
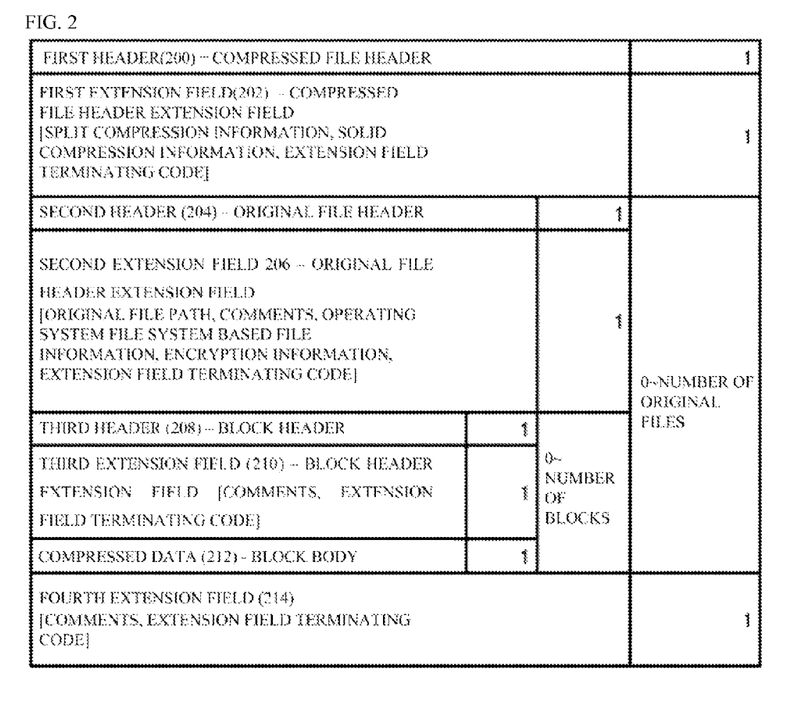
FIG. 2 illustrates a configuration of a compressed file generated by the data compression apparatus in accordance with the embodiment of the present invention.

Next, the configuration of the compressed file generated by the compressed file generating unit 110 will be described in detail with reference to FIG. 2. FIG. 2 illustrates the configuration of the compressed file generated by the data compression apparatus in accordance with the embodiment of the present invention.

As illustrated in FIG. 2, the compressed file generated by the compressed file generating unit 110 may comprise a first header 200 including information enabling identification of a compression format, a first extension field 202 including information whether the compressed file is generated by split compression or solid compression, a second header 204 including information on the original file included in the compressed file, a second extension field 206 including additional information on the original file that is not included in the second header 204, a third header 208 including information on a block, a third extension field 210 including additional information on the block, compressed data 212 including data of the block, and a fourth extension field 214 including comments on the compressed file or a code indicating the end of the compressed file.

When interpreting FIG. 2, the following should be noted. The first extension field 202, the second extension field 206, and the third extension field 210 refer to regions including related contents that are not included in the first header 200, the second header 204 and the third header 208, respectively. Accordingly, the information that may be included in each of the first extension field 202, the second extension field 206 and the third extension field 210 is not limited to that shown in FIG. 2, and the data that is not shown in FIG. 2 may be newly defined and located in the corresponding region.

That is, it can be understood that the split compression information and solid compression information included in the first extension field 202 of FIG. 2 are an extension field unit having a previously defined configuration, and the first extension field 202, the second extension field 206, the third extension field 210 and the fourth extension field (end extension field) 214 refer to regions where the extension field units can be located. Further, as illustrated in FIG. 2, it can be seen that the extension field is terminated with the extension field terminating code.

That is, the extension field is terminated with the extension field terminating code and may include one or more extension field units. However, it should be noted that the extension field may include only the extension field terminating code without including the extension field unit.

When interpreting FIG. 2, the following should be also noted. The number represented in a right cell of each data component is the number of the corresponding data components that may exist in the compressed file.

For example, with regard to the second header 204, since one second header may exist for each original file, the number of the second headers existing in the compressed file may be equal to the number of the original files to be created when the compressed file is decompressed. Further, since each original file may be divided into one or more blocks, the number of pairs of the third headers 208 and the block bodies 212 connected to one second header 204 may be equal to the number of the blocks existing in the header of the original file. However, if the original file is a folder or directory, it should be noted that the number of blocks of the original file is zero.

For example, supposing that the compressed file includes three original files (i.e., X, Y and Z files), the X file includes A and B blocks, the Y file includes C, D and E blocks, and the Z file includes F block, the compressed file according to the configuration of FIG. 2 may be configured in the following order: the first header 200→the second header 204 of the X file→the third header 208 of the A block→the block body 212 of the A block→the third header 208 of the B block→the block body 212 of the B block→the second header 204 of the Y file→the third header 208 of the C block→the block body 212 of the C block→the third header 208 of the D block→the block body 212 of the D block→the third header 208 of the E block→the block body 212 of the E block→the second header 204 of the Z file→the third header 208 of the F block→the block body 212 of the F block.

Next, the configurations of the header and the extension field unit will be compared and described with reference to FIGS. 3 and 4.

Figure 3:
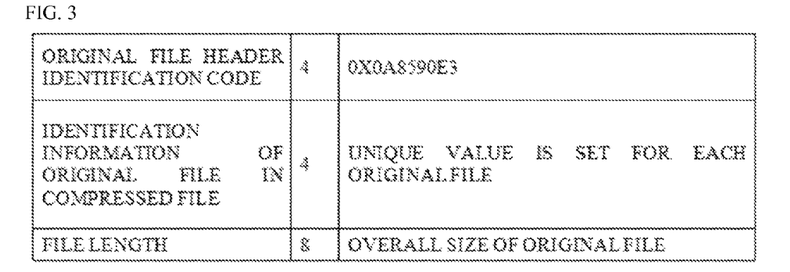
FIG. 3 illustrates a configuration of a second header that is one of headers in the configuration of the compressed file generated by the data compression apparatus in accordance with the embodiment of the present invention.
Figure 4:
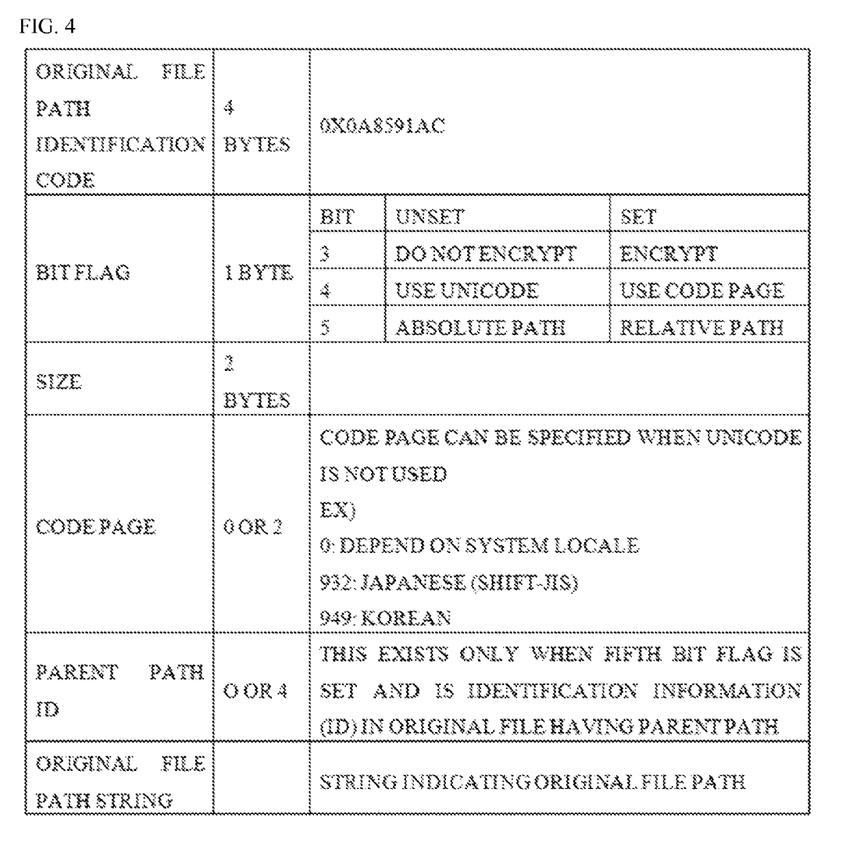
FIG. 4 illustrates a configuration of a configuration of an extension field unit of file path data that is one of extension field units included in the extension field in the configuration of the compressed file generated by the data compression apparatus in accordance with the embodiment of the present invention.

FIG. 3 illustrates a configuration of the second header 204 that is one of the above-described headers. As illustrated in FIG. 3, it can be seen that a data identification code serving as an original file header identification code is located in 4 bytes at the beginning. Referring to FIG. 4 showing a configuration of the extension field unit of file path data, which is one of the above-described extension field units, it can be seen that a data identification code serving as an original file path identification code is located in 4 bytes at the beginning in the same way as the header. That is, it is possible to know the type of data through the data identification code located in a predetermined number of initial bytes. In other words, a predetermined data identification code of the corresponding header is located in a predetermined number of initial bytes of each of the first header 200, the second header 204 and the third header 208. If a data identification code other than the predetermined data identification code is recognized, it may be determined that the data is included in the extension field unit. However, if the data identification code is neither that of the header nor that of the extension field unit, the compressed file is a compressed file of an upper version, and the extension field unit should not be processed and should be skipped. The related operation will be described in detail below.

Figure 5:
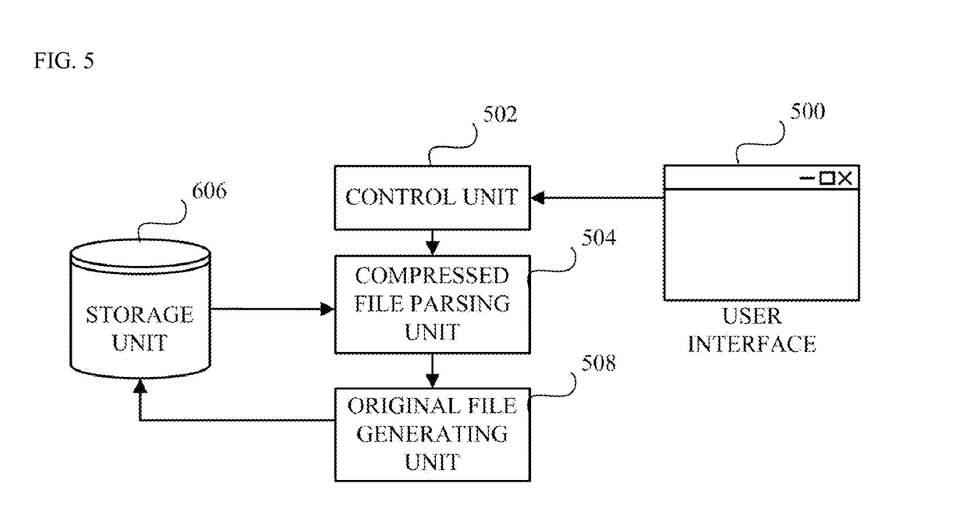
FIG. 5 illustrates a configuration of a compressed data decompression apparatus in accordance with the embodiment of the present invention.

Hereinafter, a configuration and operation of a compressed data decompression apparatus in accordance with another embodiment of the present invention will be described with reference to FIG. 5. FIG. 5 illustrates a configuration of the compressed data decompression apparatus in accordance with the embodiment of the present invention. The compressed data decompression apparatus of this embodiment may decompress the compressed file generated by the data compression apparatus. The compressed data decompression apparatus in accordance with the embodiment of the present invention may further include the configuration shown in FIG. 1 to perform the function of the data compression apparatus.

As shown in FIG. 5, the compressed data decompression apparatus in accordance with the embodiment of the present invention may include a user interface 500, a control unit 502, a compressed file parsing unit 504, a storage unit 506 and an original file generating unit 508.

The user interface 500 allows a user of the data compression apparatus to specify a compressed file to be decompressed and provides information on the compressed file to the control unit 102.

The control unit 502 transmits the information on the compressed file to the compressed file parsing unit 504.

The compressed file parsing unit 504 parses a compressed file including compressed data, a header having information on the compressed data and an extension field having one or more extension field units and an extension field terminating code to thereby extract the compressed data. In this case, each of the header and the extension field units starts with a data identification code having the same number of bytes. It is preferable that the extension field unit further includes its own length data separated by a predetermined number of bytes from its own data identification code. If the data identification code of the extension field unit is not defined while the parsing is carried out based on the data identification code, it is preferable that the compressed file parsing unit 504 skips the extension field unit using the length data without processing the extension field unit.

The compressed file parsing unit 504 may identify the types of the header and the extension field unit by parsing the data identification code. In order to recognize the data identification code, the number of bytes of the data identification code should be maintained constantly although a version of the compressed file format is changed, and the location of the data identification code also should be maintained constantly.

If the data identification code is that of the previously known header, the compressed file parsing unit 504 may determine that the following data is data of the header, and may unpack the data according to the type of the header and provide the unpacked data to the original file generating unit 508 for reference in generating the original file.

If the data identification code is not that of the previously known header, but that of the known extension field unit, the compressed file parsing unit 504 may determine that the following data is data of the extension field unit, and may unpack the data according to the type of the extension field unit and provide the unpacked data to the original file generating unit 508 for reference in generating the original file.

If the compressed file parsing unit 504 enters the extension field after it is determined that the data identification code is that of the extension field unit, the compressed file parsing unit 504 may extract data to be reflected in generating the original file from data included in the extension field unit and provide the data to the original file generating unit 508 until the extension field terminating code is detected. The original file generating unit 508 may generate the original file by reflecting the data included in the extension field unit provided from the compressed file parsing unit 504.

Meanwhile, if the data identification code is neither that of the previously known header nor that of the known extension field unit, it is preferable that the compressed file parsing unit 504 determines that the following data is data of an extension field unit which is newly supported in a compression format of an upper version, and skips the extension field unit using the length data without processing the extension field unit. For example, if the extension field unit related to the original file path information shown in FIG. 4 is unknown, the compressed file parsing unit 504 may skip one byte (Bit flag) and then jump to the next extension field unit or the extension field terminating code using the length data of the extension field unit corresponding to 2 bytes. Accordingly, it is possible to overcome a problem in which even basic decompression is impossible since the compression is performed using a function newly supported in an upper version. However, it should be noted that all extension field units should include the length data at the same location regardless of the version of the compression format.

The storage unit 506 stores the compressed file and the original file generated by the original file generating unit 508.

The original file generating unit 508 decompresses the compressed data to generate the original file.

Hereinafter, a compressed data decompression method in accordance with still another embodiment of the present invention will be described. The technical features of the compressed data decompression apparatus in accordance with the embodiment of the present invention may be applied to the compressed data decompression method of this embodiment.

First, compressed data is extracted by parsing a compressed file including the compressed data, a header having information on the compressed data, and an extension field having one or more extension field units and an extension field terminating code.

The step of extracting the compressed data by parsing the compressed file may include, if the data identification code of the extension field unit is not defined while the parsing is carried out based on the data identification code, skipping the extension field unit using the length data without processing the extension field unit.

More specifically, after extracting and recognizing the data identification code located at the beginning of the header and the extension field unit, if the data identification code is that of the previously known header, it is determined that the following data is data of the header, and the data is unpacked according to the type of the header for reference in generating the original file.

Further, if the data identification code is not that of the previously known header, but that of the known extension field unit, it is determined that the following data is data of the extension field unit, and the data is unpacked according to the type of the extension field unit for reference in generating the original file. If it is determined to enter the extension field after it is determined that the data identification code is that of the extension field unit, data included in the extension field unit is reflected in generating the original file until the extension field terminating code is detected.

Meanwhile, if the data identification code is neither that of the previously known header nor that of the known extension field unit, it is determined that the following data is data of an extension field unit which is newly supported in a compression format of an upper version, and it is preferable to skip the extension field unit using the length data without processing the extension field unit.

Each of the header and the extension field units starts with a data identification code having the same number of bytes. It is preferable that the extension field unit further includes its own length data separated by a predetermined number of bytes from its own data identification code.

Then, the compressed data is decompressed based on the data extracted from the header and the extension field unit to thereby generate the original file.

Hereinafter, a computer-readable recording medium storing a program in accordance with still another embodiment of the present invention will be described. The technical features of the data compression apparatus and the compressed data decompression apparatus in accordance with the embodiments of the present invention may be applied to the computer-readable recording medium.

The recording medium may be at least one of a nonvolatile memory element such as a cache, read only memory (ROM), programmable ROM (PROM), erasable PROM (EPROM), electrically erasable PROM (EEPROM) and flash memory, a volatile memory element such as random access memory (RAM), and a storage medium such as a hard disk drive (HDD).

The computer-readable recording medium storing a program in accordance with the embodiment of the present invention stores a program having a function of generating compressed data by applying a compression algorithm to the data to be compressed, and a function of generating a compressed file including the compressed data, a header having information on the compressed data and an extension field having one or more extension field units and an extension field terminating code, wherein each of the header and the extension field units starts with a data identification code having the same number of bytes, and the extension field unit further includes its own length data separated by a predetermined number of bytes from its own data identification code.

As another example, the computer-readable recording medium storing a program in accordance with the embodiment of the present invention stores a program having a function of parsing a compressed file including compressed data, a header having information on the compressed data and an extension field having one or more extension field units and an extension field terminating code to thereby extract the compressed data, and a function of decompressing the compressed data to generate an original file, wherein each of the header and the extension field units starts with a data identification code having the same number of bytes, and the extension field unit further includes its own length data separated by a predetermined number of bytes from its own data identification code. The function of extracting the compressed data by parsing the compressed file further includes, if the data identification code of the extension field unit is not defined while the parsing is carried out based on the data identification code, a function of skipping the extension field unit using the length data without processing the extension field unit.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

INDUSTRIAL APPLICABILITY

By applying the present invention to data compression technology, a file compressed in an application supporting a compressed file format of an upper version can be decompressed in an application supporting a compressed file format of a lower version.

What is claimed is:

1. A data compression apparatus comprising:
 a compression unit, executed by a processor, which generates compressed data by applying a compression algorithm to data to be compressed; and
 a compressed file generating unit, executed by the processor, which generates a compressed file comprising the compressed data, a header including information on the compressed data, and an extension field,
 wherein the extension field includes one or more extension field units and an extension field terminating code indicating an end of a region capable of including the one or more extension field units, each of the header and the one or more extension field units starts with a data identification code having the same number of bytes, and an extension field unit of the one or more extension field units further includes its own length data separated by a predetermined number of bytes from its own data identification code, and wherein the header is divided into multiple headers according to first included information, and the extension field is divided into multiple extension fields according to second included information, and wherein the compressed file has a configuration in which the multiple headers, the multiple extension fields, and the compressed data are located by predefined sequence for supporting minimum decompression regardless of a version of compressed file format.

2. The data compression apparatus of claim 1, wherein the multiple headers include a first header, a second header and a third header according to the first included information, and the multiple extension fields include a first extension field, a second extension field, a third extension field and a fourth extension field according to the second included information, and wherein the first extension field is located after the first header, the second extension field is located after the second header, the third extension field is located after the third header, and the fourth extension field is located at an end of the compressed file.

3. A data compression apparatus comprising:
a compression unit, executed by a processor, which generates compressed data by applying a compression algorithm to data to be compressed; and
a compressed file generating unit, executed by the processor, which generates a compressed file comprising the compressed data, a header including information on the compressed data, and an extension field,
wherein the extension field includes one or more extension field units and an extension field terminating code indicating an end of a region capable of including the one or more extension field units, each of the header and the one or more extension field units starts with a data identification code having the same number of bytes, and an extension field unit of the one or more extension field units further includes its own length data separated by a predetermined number of bytes from its own data identification code,
wherein the header is divided into a first header, a second header and a third header according to first included information, and the extension field is divided into a first extension field, a second extension field, a third extension field and a fourth extension field according to second included information, and wherein the first extension field is located after the first header, the second extension field is located after the second header, the third extension field is located after the third header, and the fourth extension field is located at an end of the compressed file, and
wherein the compressed file has a configuration in which the first header enabling identification of a compression format, the first extension field including information associated with the first header, the second header including information on an original file included in the compressed file, the second extension field including information associated with the second header, the third header including information on each block in the original file, the third extension field including information associated with the third header, the compressed data of a block corresponding to the third header, and the fourth extension field indicating the end of the compressed file are sequentially located.

4. A compressed data decompression apparatus comprising:
a compressed file parsing unit, executed by a processor, which parses a compressed file comprising compressed data, a header including information on the compressed data and an extension field to extract the compressed data; and
an original file generating unit, executed by the processor, which decompresses the compressed data to generate an original file,
wherein the extension field includes one or more extension field units and an extension field terminating code indicating an end of a region capable of including the one or more extension field units, each of the header and the one or more extension field units starts with a data identification code having the same number of bytes, and an extension field unit of the one or more extension field units further includes its own length data separated by a predetermined number of bytes from its own data identification code,
wherein if the data identification code of the extension field unit is not defined while the parsing is carried out based on the data identification code, the compressed file parsing unit skips the extension field unit using the length data without processing the extension field unit, and
wherein the header is divided into multiple headers according to first included information, and the extension field is divided into multiple extension fields according to second included information, and wherein the compressed file has a configuration in which the multiple headers, the multiple extension fields, and the compressed data are located by predefined sequence for supporting minimum decompression regardless of a version of compressed file format.

5. The compressed data decompression apparatus of claim 4, wherein the compressed file parsing unit identifies types of the header and the extension field unit by parsing the data identification code.

6. The compressed data decompression apparatus of claim 5, wherein the compressed file parsing unit extracts data to be reflected in generating the original file from data included in the extension field unit and provides the data to the original file generating unit until the extension field terminating code is detected, and the original file generating unit generates the original file by reflecting the data included in the extension field unit provided from the compressed file parsing unit.

7. A compressed data decompression method comprising:
parsing, by a processor, a compressed file comprising compressed data, a header including information on the compressed data, and an extension field to extract the compressed data; and
decompressing, by the compressed data to generate an original file,
wherein the extension field includes one or more extension field units and an extension field terminating code indicating an end of a region capable of including the one or more extension field units, each of the header and the one or more extension field units starts with a data identification code having the same number of bytes, and an extension field unit of the one or more extension field units further includes its own length data separated by a predetermined number of bytes from its own data identification code,
wherein said parsing the compressed file to extract the compressed data includes, if the data identification code of the extension field unit is not defined while the parsing is carried out based on the data identification code, skipping the extension field unit using the length data without processing the extension field unit, and wherein the header is divided into multiple headers according to first included information, and the extension field is divided into multiple extension fields according to second included information, and wherein the compressed file has a configuration in which the multiple headers, the multiple extension fields, and the compressed data are located by predefined sequence for supporting minimum decompression regardless of a version of compressed file format.

8. A non-transitory computer-readable recording medium storing a program executed by a processor, the program comprising:

a function of generating compressed data by applying a compression algorithm to data to be compressed, and a function of generating a compressed file including the compressed data, a header having information on the compressed data and an extension field, wherein the extension field includes one or more extension field units and an extension field terminating code indicating an end of a region capable of including the one or more extension field units, each of the header and the one or more extension field units starts with a data identification code having the same number of bytes, and an extension field unit of the one or more extension field units further includes its own length data separated by a predetermined number of bytes from its own data identification code, and wherein the header is divided into multiple headers according to first included information, and the extension field is divided into multiple extension fields according to second included information, and wherein the compressed file has a configuration in which the multiple headers, the multiple extension fields, and the compressed data are located by predefined sequence for supporting minimum decompression regardless of a version of compressed file format.

9. A non-transitory computer-readable recording medium storing a program executed by a processor, the program comprising:

a function of parsing a compressed file including compressed data, a header having information on the compressed data and an extension field to extract the compressed data, and a function of decompressing the compressed data to generate an original file, wherein the extension field includes one or more extension field units and an extension field terminating code indicating an end of a region capable of including the one or more extension field units, each of the header and the one or more extension field units starts with a data identification code having the same number of bytes, and an extension field unit of the one or more extension field units further includes its own length data separated by a predetermined number of bytes from its own data identification code, wherein the function of parsing the compressed file to extract the compressed data further includes, if the data identification code of the extension field unit is not defined while the parsing is carried out based on the data identification code, a function of skipping the extension field unit using the length data without processing the extension field unit, and wherein the header is divided into multiple headers according to first included information, and the extension field is divided into multiple extension fields according to second included information, and wherein the compressed file has a configuration in which the multiple headers, the multiple extension fields, and the compressed data are located by predefined sequence for supporting minimum decompression regardless of a version of compressed file format.

* * * * *